United States Patent [19]

Hatsuda et al.

[11] Patent Number: 5,276,586
[45] Date of Patent: Jan. 4, 1994

[54] BONDING STRUCTURE OF THERMAL CONDUCTIVE MEMBERS FOR A MULTI-CHIP MODULE

[75] Inventors: Toshio Hatsuda, Ibaraki; Takahiro Daikoku, Ushiku; Tetsuya Hayashida, Tokyo; Noriyuki Ashiwake, Tsuchiura; Fumiyuki Kobayashi, Sagamihara; Keizou Kawamura; Sohji Sakata, both of Ibaraki, all of Japan

[73] Assignee: Hitachi, Ltd., Tokyo, Japan

[21] Appl. No.: 872,178

[22] Filed: Apr. 22, 1992

[30] Foreign Application Priority Data

Apr. 25, 1991 [JP] Japan .................. 3-095146

[51] Int. Cl.⁵ .................................. H05K 7/20
[52] U.S. Cl. ........................... 361/387; 165/185; 257/707; 361/385
[58] Field of Search .............. 165/80.3, 185, 80.4; 257/706, 707, 713, 714, 717, 719; 174/52.4, 16.3; 361/382, 385, 386, 387, 388, 389

[56] References Cited

U.S. PATENT DOCUMENTS

| 4,339,768 | 7/1982 | Keller | 357/72 |
| 4,346,396 | 8/1982 | Carroll, II | 357/70 |
| 4,561,011 | 12/1985 | Kohara | 357/81 |
| 4,612,601 | 9/1986 | Watari | 361/387 |
| 4,879,632 | 11/1989 | Yamamoto | 361/386 |
| 4,924,352 | 5/1990 | Septfons | 361/388 |

FOREIGN PATENT DOCUMENTS 61-36961 2/1986 Japan .

Primary Examiner—Gerald P. Tolin
Attorney, Agent, or Firm—Antonelli, Terry, Stout & Kraus

[57] ABSTRACT

A semiconductor module comprises a substrate, a plurality of semiconductor chips mounted on the substrate, a plurality of heat conduction members mounted on the back surfaces of the plurality of semiconductor chips, respectively, and a cooling jacket, on which the plurality of heat conduction members are bonded with heat conductive bonding agent, sealed with the substrate, wherein, in a surface of each of the plurality of heat conduction members adjacent to the cooling jacket and in a surface of the cooling jacket adjacent to the heat conduction members, around a portion corresponding to the back surface of each of the semiconductor chip is formed a portion which has non-affinity for the heat conductive bonding agent. Further, it is preferred that a reservoir having an affinity for the heat conductive bonding agent and serving to receive an excessive bonding agent is formed around each of the non-affinity portions of the plurality of heat conduction members and the cooling jacket.

11 Claims, 7 Drawing Sheets

BONDING STRUCTURE OF THERMAL CONDUCTIVE MEMBERS FOR A MULTI-CHIP MODULE

BACKGROUND OF THE INVENTION

This invention relates to a semiconductor module having semiconductor chips packaged therein, and more particularly, to a semiconductor module which is suitable for cooling the semiconductor chip in the module.

In order to cool the semiconductor chip mounted on a substrate of the semiconductor module, it is important that the chip is thermally brought into contact with a cooling jacket, preferably, it is desirable that the chip is directly brought into contact with the cooling jacket. However, there is dispersion of height of the chips mounted on the substrate resulting from a wraping of the substrate, dispersion in size of the connecting portions between the chips and the substrate and the like. This makes it hard to bring the chip directly into contact cooling jacket.

An example of a method for making the cooling jacket come into contact with the chips uniformly includes the one disclosed in U.S. Pat. No. 4,561,011. According to this conventional technique, a heat conductive bonding agent is placed between the chips and heat conduction members disposed thereabove (FIG. 1) and the cooling jacket is pressed against the heat conduction members when the bonding agent is being solidified in such a manner that the cooling jacket and the heat conduction members are brought into close contact with each other.

However, when the above conventional method is put into practice, there arise the following problems. In a case in which an amount of supply of the bonding agent is suitable for the higher chip, the bonding agent supplied to the lower chip is allowed to spread over the entire bonding surface since the bonding surface is generally made of a material with high affinity for the bonding agent. As a result, concerning the lower chip, voids are formed in the layer of the bonding agent serving to transfer heat as shown in FIG. 2, with the result that the heat transfer efficiency is deteriorated. Further, in a case in which an amount of supply of the bonding agent is suitable for the lower chip, the bonding agent supplied to the higher chip is excessive, thereby giving rise to a problem that the excess bonding agent is poured out toward the chip connecting portion or torn into drops as shown in FIG. 3 which can cause problems, such as a short circuit. Consequently, it has been required to take measures so as to adjust the amount of supply of the bonding agent for each chip.

An object of the present invention is to provide a semiconductor module of the structure that, even if there is dispersion in height of semiconductor chips mounted on a substrate, necessary portions are filled with a bonding agent without fail while preventing the excess bonding agent from being poured out toward chip connecting portions, and a manufacturing method therefor.

Another object of the present invention is to provide a semiconductor module in which bonding agent filling portions are each filled with a sufficient amount of bonding agent so as to achieve a high heat transfer efficiency while preventing the excess bonding agent from pouring out toward the chip connecting portions to damage the same.

Still another object of the present invention is to easily manufacture a semiconductor module of high heat transfer efficiency by enabling the excess bonding agent to be held automatically in predetermined positions.

A further object of the present invention is to provide a method for manufacturing a semiconductor module which is free from a problem in which the excess bonding agent pours out toward the chip connecting portions and, hence, which can achieve a high heat transfer efficiency.

SUMMARY OF THE INVENTION

A semiconductor module according to the present invention comprises a substrate, a plurality of semiconductor chips mounted on the substrate, a plurality of heat conduction members mounted on back surfaces of the plurality of semiconductor chips, respectively, and a cooling jacket, on which the plurality of heat conduction members are bonded with a heat conductive bonding agent, sealed with the substrate, wherein, in a surface of each of the plurality of heat conduction members adjacent to the cooling jacket and in a surface of the cooling jacket adjacent to the heat conduction members, around a portion corresponding to the back surface of each of the semiconductor chips is formed a portion which is characterized as being a nonaffinity for the heat conductive bonding agent.

Further, it is preferred that a reservoir having an affinity for the heat conductive bonding agent and serving to receive an excess bonding agent is formed around each of the non-affinity portions of the plurality of heat conduction members and the cooling jacket.

In a case in which the heat conductive bonding agent is solder, the heat conduction members are each made of a ceramic material, and the cooling jacket is made of a metallic material, it is possible to form solder filling portions by coating a surface of each of the ceramic heat conduction members adjacent to the cooling jacket with a metallized layer having an affinity for the solder in the portion corresponding to the back surface of the semiconductor chip as well as to form non-affinity portions by coating a resin layer around portions corresponding to the solder filling portions of the metallic cooling jacket.

In this case, it is also possible that each of the ceramic heat conduction members is coated with a second metallized layer around a surface portion thereof corresponding to the non-affinity portion. Further, it is preferred that the metallic cooling jacket is coated on the surface thereof adjacent to the heat conduction members with a plurality of resin layers so as to divide this surface into squares for the respective semiconductor chips.

In addition, it is preferred that the non-affinity portions of the cooling jacket and of the heat conduction members are formed in the shape . It is preferred that the space between the reservoir of the cooling jacket and the reservoir of the heat conduction member is made narrower at an inlet portion of the reservoir than at an inner part thereof.

In a case in which the heat conductive bonding agent is solder, the cooling jacket is made of a ceramic material, and the heat conduction members are each made of a ceramic material, it is possible that the cooling jacket is projected and coated with a metallized layer on the surface thereof adjacent to the heat conduction members in surface portions corresponding to the back surfaces of the semiconductor chips, and each of the heat conduction members is formed in a concave shape so as to receive a respective projected portion of the cooling jacket, which is coated with a metallized layer, in surface portion thereof corresponding to the back surface of the semiconductor chip.

A semiconductor module according to another aspect of the present invention comprises a substrate, a plurality of semiconductor chips mounted on the substrate, a plurality of heat conduction members bonded onto the back surfaces of the plurality of semiconductor chips with a heat conductive bonding agent, respectively, each of the heat conduction members having a portion with non-affinity for the heat conductive bonding agent formed around a surface portion thereof corresponding to the back surface of the semiconductor chip and a reservoir formed around this non-affinity portion for serving to receive an excess bonding agent, and a cooling jacket kept in contact with the plurality of heat conduction members through a heat conductive fluid and sealed with the substrate.

A semiconductor module according to still another aspect of the present invention comprises a substrate, a plurality of semiconductor chips mounted on the substrate, a plurality of heat conduction members mounted on the back surfaces of the plurality of semiconductor chips through a heat conductive fluid, respectively, each of the heat conduction members being formed by heat conduction plates bonded to each other with a heat conductive bonding agent, and each of the heat conduction plates having a portion with non-affinity for the heat conductive bonding agent formed around a surface portion thereof corresponding to the back surface of the semiconductor chip and a reservoir formed around the non-affinity portion for serving to receive an excess bonding agent, and a cooling jacket kept in contact with the plurality of heat conduction members through the heat conductive fluid and sealed with the substrate.

A semiconductor module according to a further aspect of the present invention comprises a substrate, a plurality of semiconductor chips mounted on the substrate, a plurality of heat conduction members mounted on the back surfaces of the plurality of semiconductor chips through a heat conductive fluid, respectively, each of the heat conduction members being formed by heat conduction plates bonded to each other with a heat conductive bonding agent, and the side surfaces of each of the heat conduction plates having non-affinity for the heat conductive bonding agent, and a cooling jacket kept in contact with the plurality of heat conduction members through the heat conductive fluid and sealed with the substrate.

The first-described semiconductor module can be manufactured by the following method.

A method for manufacturing a semiconductor module comprising the steps of: mounting a plurality of semiconductor chips on a substrate; preparing a plurality of heat conduction members each of which is formed in one surface thereof with a portion having non-affinity for heat conductive bonding agent around a portion corresponding to a back surface of the chip; mounting the plurality of heat conduction members on the back surfaces of the plurality of semiconductor chips, respectively, with the surfaces thereof in which the non-affinity portions are formed being faced upwardly; putting a block of heat conductive bonding agent on each of the plurality of heat conduction members; preparing a cooling jacket which is formed in a surface thereof adjacent to the heat conduction members with portions having non-affinity for the heat conductive bonding agent; and sealing the cooling jacket with the substrate by pressing it against the heat conduction members while melting the blocks of heat conductive bonding agent by heating, thereby solidifying the excess bonding agent in the non-affinity portions.

A semiconductor module using heat conduction members each formed by two heat conduction half members can be manufactured by the following method.

A method for manufacturing a semiconductor module comprising the steps of: mounting a plurality of semiconductor chips on a substrate; preparing a plurality of heat conduction members each of which is formed in one surface thereof with a portion having a non-affinity for a heat conductive bonding agent around a portion corresponding to the back surface of the chip and a portion having an affinity for the heat conductive bonding agent around the non-affinity portion; mounting the plurality of heat conduction members on the back surfaces of the plurality of semiconductor chips, respectively, with the surfaces thereof in which the non-affinity portions are formed being faced upwardly; putting a block of heat conductive bonding agent on each of the plurality of heat conduction members; preparing a cooling jacket which is formed in a surface thereof adjacent to the heat conduction members with portions having a non-affinity for the heat conductive bonding agent and portions having an affinity for the same around the non-affinity portions; and sealing the cooling jacket with the substrate by pressing it against the heat conduction members while melting the blocks of heat conductive bonding agent by heating, thereby receiving the excess bonding agent in the affinity portions.

In case that the heat conduction members are each formed by two heat conduction half members, the following manufacturing method is applicable as well.

A method for manufacturing a semiconductor module comprising the steps of: mounting a plurality of semiconductor chips on a substrate; measuring the height of the mounted semiconductor chips and showing the results of measurement again on simulation chips of a simulation means; putting on the simulation chips a plurality of heat conduction members each of which is formed by two heat conduction plates and a block of heat conductive bonding agent is held between them; pressing a cooling jacket against the simulation chips while melting the blocks of bonding agent by heating; solidifying the bonding agent to obtain a plurality of heat conduction members in which connection is made of any dispersion in height of the semiconductor chips; putting the plurality of heat conduction members on the back surface of the semiconductor chips through a heat conductive fluid, respectively; and after applying the heat conductive fluid on the plurality of heat conduction members, sealing the cooling jacket with the substrate.

According to the present invention, the bonding agent is prevented from flowing out from the filling portion by the portion with non-affinity for the heat conductive bonding agent which is formed in the heat conduction member and/or the cooling jacket around the portion corresponding to the back surface of the semiconductor chip, that is, around the bonding agent filling portion, and therefore, a sufficient amount of bonding agent can be held in the filling portion and, hence, occurrence of any void can be prevented. Further, since the excess bonding agent is solidified in the non-affinity portion as it is kept as one body with the bonding agent in the filling portion or held in the reservoir, it is prevented from being torn into drops or pouring out toward the chip connecting portion. Consequently, during a manufacture of the semiconductor module, even if there is dispersion in height of the mounted semiconductor chips, it becomes possible to correct the dispersion in height by supplying more bonding agent to where it is needed, thereby making it easy to manufacture the semiconductor module.

DESCRIPTION OF THE PREFERRED EMBODIMENTS

Figure 1:
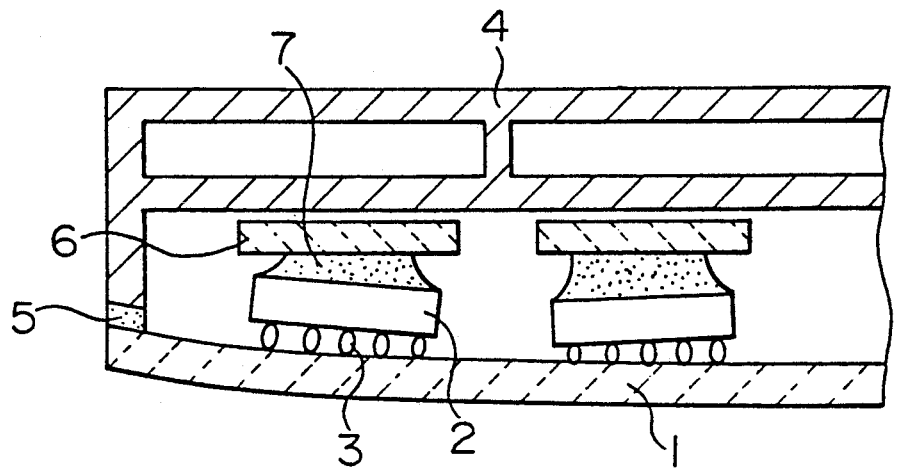
FIG. 1 is a sectional view of a conventional semiconductor module.
Figure 2:
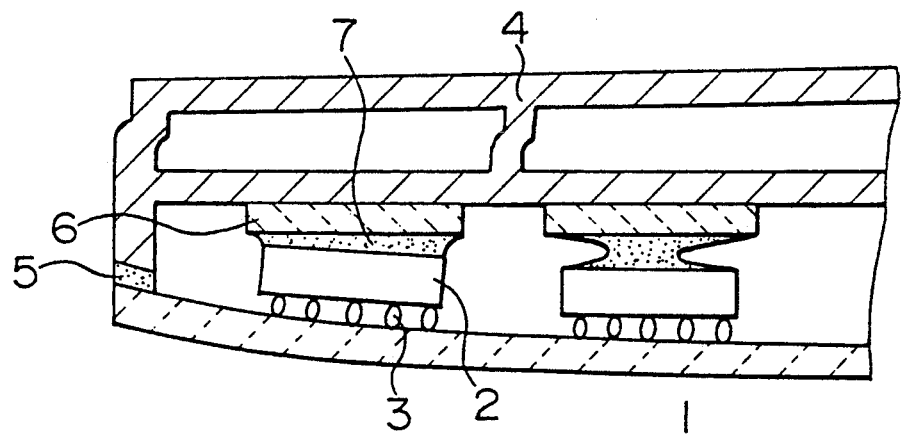
FIG. 2 is a sectional view of the conventional semiconductor module, illustrating a state in which a void is formed in the layer of bonding agent supplied between a back surface of a semiconductor chip and a heat conduction member.
Figure 3:
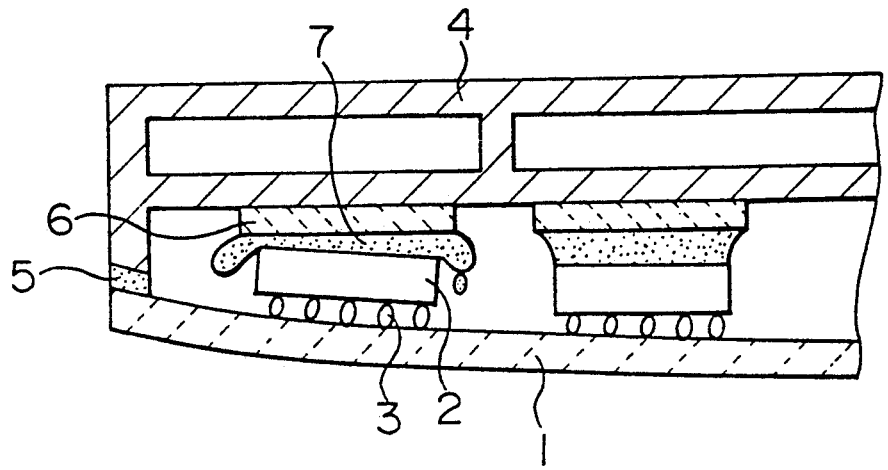
FIG. 3 is a sectional view of the conventional semiconductor module, illustrating a state in which the bonding agent supplied between the back surface of the semiconductor chip and the heat conduction member is torn into drops which can move freely within the module and poured out toward the chip connecting portion.
Figure 4:
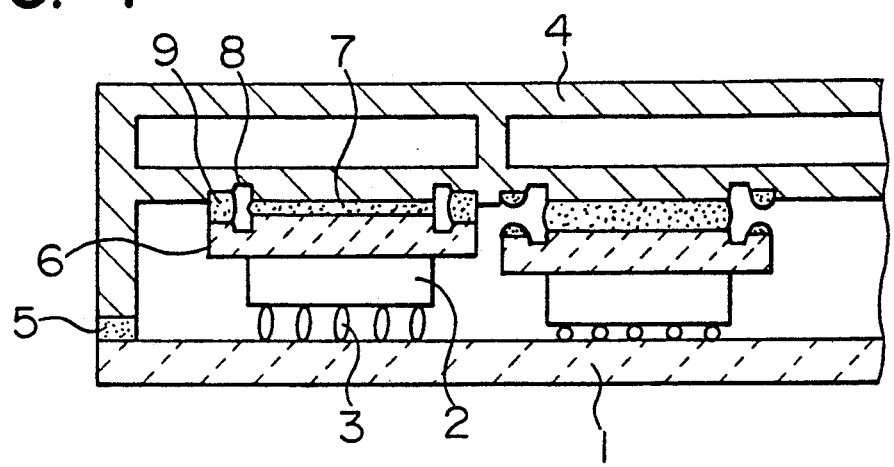
FIG. 4 is a sectional view of a semiconductor module according to a first embodiment of the present invention.

Description will be given hereinafter of a first embodiment of the present invention with reference to FIGS. 4 to 8. In order to protect semiconductor chips 2, mounted on a substrate 1 by means of connecting means 3, such as solder balls, a casing formed with a built-in cooling jacket 4 is sealed with the substrate 1 through a sealing portion 5. In order to absorb dispersion in height of the mounted chips 2 and improve the thermal conduction between the chips 2 and the cooling jacket 4, heat conduction members 6 are secured to the cooling jacket by means of a heat conductive bonding agent 7 such as a solder. Suitable examples of the heat conductive bonding agent 7 include a tin-lead solder and a tin-silver solder. In the cooling jacket 4 and the heat conduction members 6, around a portion corresponding to a back surface of each chip is formed a groove 8 which has a non-affinity for the bonding agent, and further around the groove 8 is formed a reservoir 9 for serving to hold an excess of the bonding agent. This reservoir 9 has affinity for the bonding agent. Since the excess of the heat conductive bonding agent is received in the reservoir 9, it is possible to prevent the excess of the heat conductive bonding agent from pouring toward the tip connecting portion and from being torn into drops.

Figure 5:
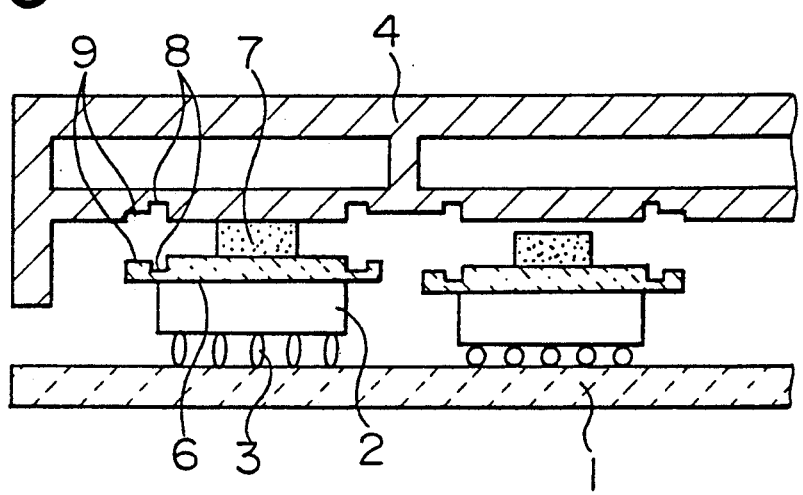
FIG. 5 is a sectional view illustrating a method for manufacturing the first embodiment.
Figure 6:
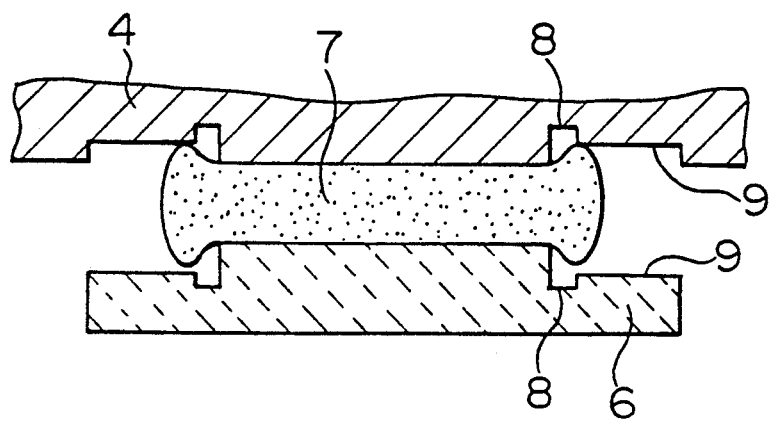
FIGS. 6 to 8 are sectional views of the first embodiment, showing essential portions thereof for explanation of the behavior of the bonding agent during the manufacturing process.
Figure 7:
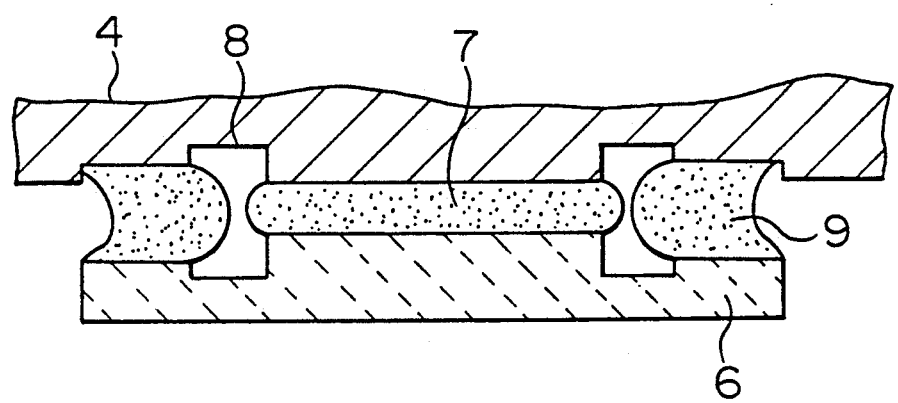
Figure 8:
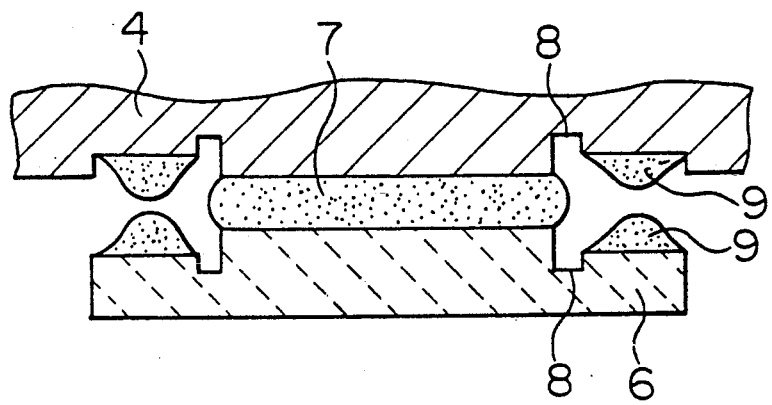

With the above-mentioned construction, a method for correcting dispersion in height of the chips will be described by referring to FIGS. 5 to 8. As shown in FIG. 5, the heat conduction member 6 is placed on each of the chips 2 mounted on the substrate 1, and a block of the heat conductive bonding agent 7 such as solder is provided on the heat conduction member 6. In this state, the temperature is raised to melt the bonding agent and the cooling jacket 4 is pressed against the same so as to form bonding agent layers having thicknesses correcting the dispersion in height of the chips 2, respectively. In case that the melted bonding agent has an excess amount, it is squeezed out beyond the portion corresponding to the back surface of the chip as shown in FIG. 6 when applied with a predetermined pressure. The tip end of the bonding agent thus squeezed is extended, by passing non-affinity groove 8 and comes into contact with the reservoir 9, in which the excess of the bonding agent begins to pour into the reservoir 9 to stay therein. When the cooling jacket 4 and the substrate 1 are located, a force for squeezing the bonding agent disappears, so that the bonding agent is cut off at the non-affinity groove 8 due to surface tension as shown in FIG. 7. As a result, there is no possibility that the bonding agent is poured into the reservoir 9 more than needed. Further, when the quantity of the bonding agent poured into the reservoir 9 is small, the bonding agent is received in the reservoir 9 as being separated into upper and lower parts as shown in FIG. 8.

In consequence, according to this embodiment, even if the bonding agent is supplied excessively, the excessive bonding agent can be received in the reservoir 9, and therefore, it is possible not only to prevent the excessive bonding agent from pouring toward the chip connecting portion, which can be damaging the chips, also to eliminate the possibility that the bonding agent is poured into the reservoir 9 more than needed to cause voids in the bonding agent layer formed on the back surface of the chips, with the result that a high heat transfer efficiency can be obtained.

Figure 9:
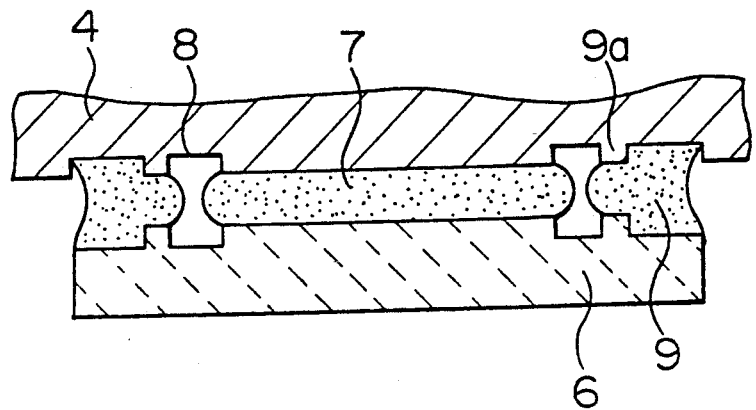
FIG. 9 is a sectional view of a modification of the first embodiment, showing essential portions thereof.

The reservoir 9 needs to have a larger volume than the quantity of the bonding agent to be supplied, since there is a possibility that the thickness of the bonding agent layer to be formed on the highest chip will become 0 (zero). Further, by moving the cooling jacket slightly at the time when the bonding agent is melted and brought into contact with the cooling jacket, the cooling jacket and the heat conduction member can be self-aligned with each other owing to the surface tension of the bonding agent. If an opening of an inlet portion 9a of the reservoir 9 is narrowed as shown in FIG. 9, the bonding agent poured in the reservoir 9 can be held with higher reliability.

Figure 10:
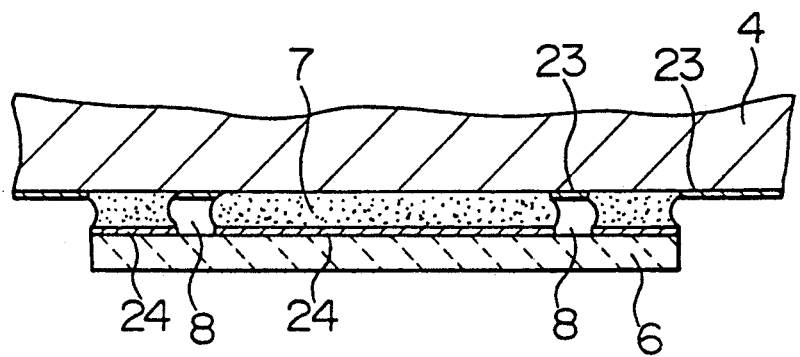
FIG. 10 is a sectional view of a semiconductor module according to a second embodiment of the present invention, showing essential portions thereof.
Figure 11:
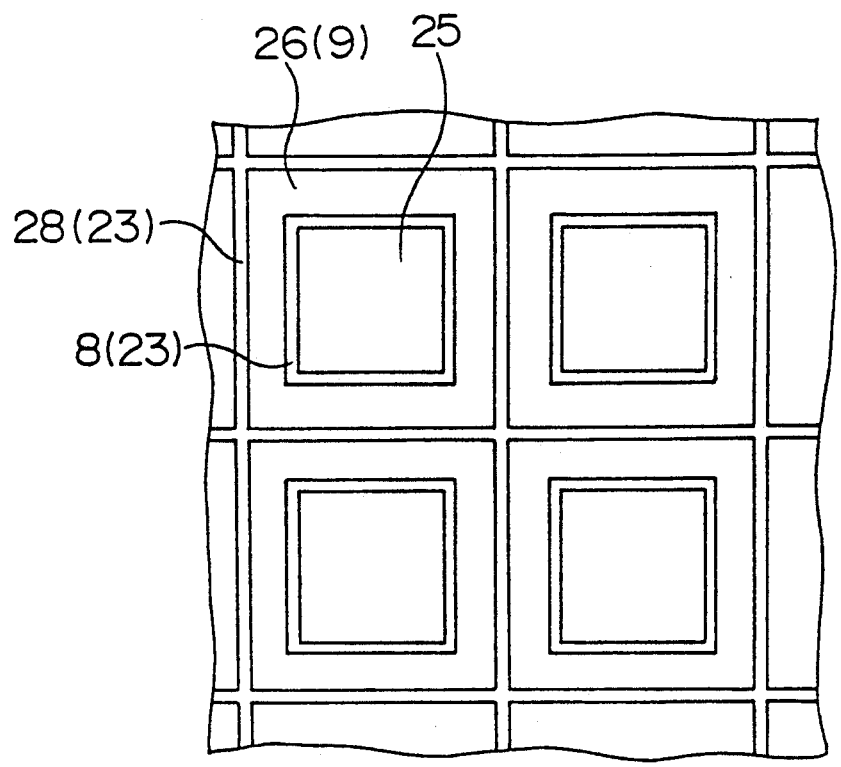
FIGS. 11 and 12 are plan views each showing the inner surface of a cooling jacket to be used in the second embodiment.
Figure 12:
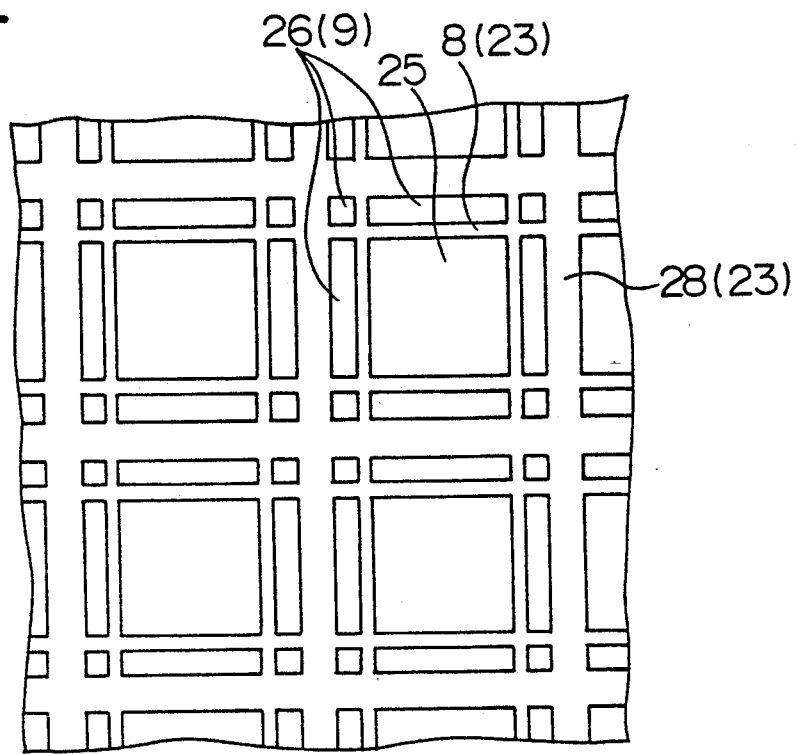

In the above-described embodiment, the portion 8 with non-affinity for the bonding agent has been described as being formed in a groove shape, and however, it is not always necessary for the portion 8 to be formed in a groove shape. For example, in a case in which the solder is used as the bonding agent, the cooling jacket 4 is made of a metallic material and the heat conduction member 6 is made of a ceramic material, in order to form the non-affinity portion 8, a non-affinity resin 23 may be printed on the cooling jacket 4 around a portion corresponding to the back surface of the chip as shown in FIG. 10. On the other hand, the ceramic heat conduction member 6 may be metallized in a bonding agent filling portion thereof corresponding to the back surface of the chip as well as in a portion thereof serving as the reservoir of the bonding agent so as to form affinity layers, while the other portion thereof in which the non-affinity portion 8 is to be formed being left as it is. The pattern of formation of the affinity and non-affinity portions on the cooling jacket 4 is as shown in FIG. 11. Around the affinity portion serving as a filling portion 25 of the bonding agent 7 which corresponds to the back surface of each chip, the non-affinity portion 8 is formed by the resin 23. Further around the non-affinity portion 8 is formed an affinity portion 26 serving as the reservoir 9 of the bonding agent. Further, a non-affinity portion 28 is formed by the resin 23 so as to divide the respective chip areas from each other with the intension of preventing the bonding agent supplied for each chip from interfering with each other. If the pattern of FIG. 11 makes it hard to form a mask, it is possible to change the pattern as shown in FIG. 12. Namely, the width of the non-affinity portion 28 serving to divide the chip areas is increased to prevent interference while the width of the non-affinity portion 8 formed around the chip is made small to permit the bonding agent to pour out from the bonding agent filling portion 25 into the reservoir 9 with ease. In the embodiment described above, the portion serving as the reservoir 9 has been described as having the affinity for the bonding agent, and however, it is not always necessary for the portion serving as the reservoir 9 to have the affinity. In this case, however, in order to prevent the bonding agent from pouring out, the structure needs to be so designed as to be able to catch the bonding agent, as shown in FIGS. 13 and 14.

Figure 13:
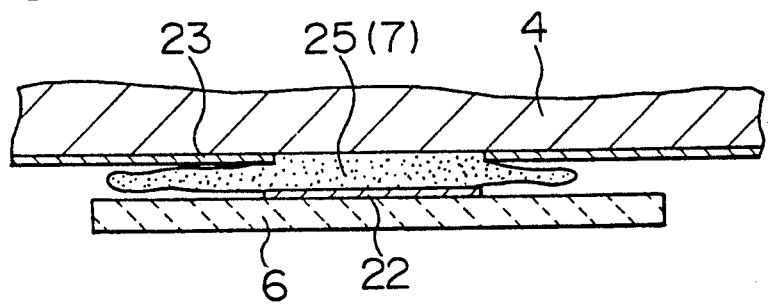
FIG. 13 is a sectional view of a semiconductor module according to a third embodiment of the present invention, showing essential portions, thereof.

More specifically, in a third embodiment of FIG. 13, the metallic cooling jacket 4 is entirely coated with the non-affinity resin 23 except for the bonding agent filling portion 25, while the ceramic heat conduction member 6 is formed with the metallized layer only in the bonding agent filling portion 25. The bonding agent 7 is adhered to the cooling jacket and the back surface of the heat conduction member only at the filling portion 25. The heat conduction member 6 is so designed as to have a volume enough to absorb the whole of the bonding agent poured out toward the non-affinity portion 8. In consequence, the bonding agent 7 can be stayed and solidified between the cooling jacket 4 and the heat conduction member 6, so that it can be prevented from pouring down toward the electrically connecting portion or the like.

Figure 14:
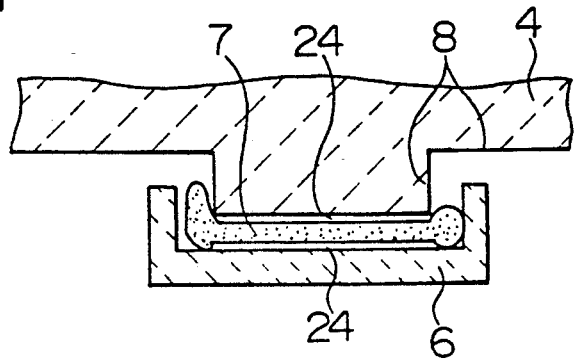
FIG. 14 is a sectional view of a semiconductor module according to a fourth embodiment of the present invention, showing essential portions, thereof.

In a fourth embodiment of FIG. 14, the ceramic cooling jacket 4 is partially made to project and a metallized layer 24 is formed on top surfaces of the thus projected portions. On the other hand, the heat conduction member 6 is formed in a concave shape so as to surround the projected portion of the cooling jacket with the metallized layer 24 formed on a bottom surface thereof only in a portion to which the bonding agent is to be adhered.

When the cooling jacket 4 is pressed against the heat conduction member 6, the bonding agent 7 is squeezed out between them. Since the non-affinity portion 8 is formed around the metallized layer 24, the bonding agent 7 thus squeezed is solidified as it is kept as one body with the bonding agent 7 filled between the metallized layers 24 without adhering to the peripheral portion. In consequence, the excessive bonding agent can be held in the concaved portion of the heat conduction member 6 without being poured out to the outside.

Figure 15:
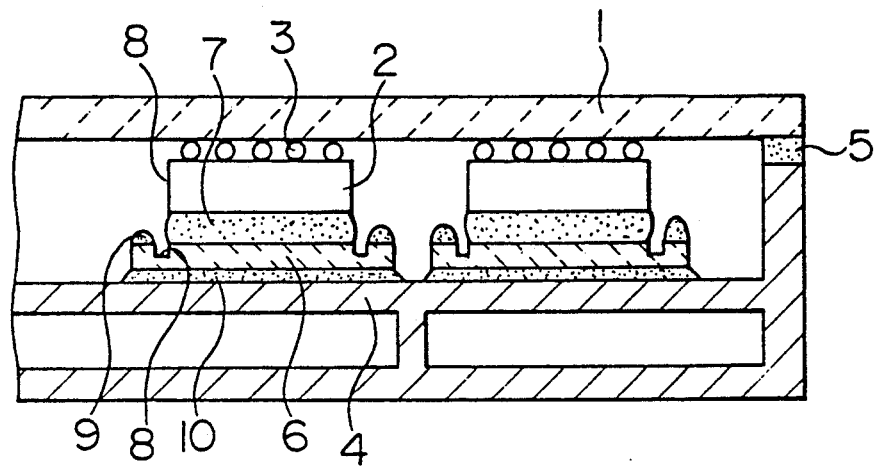
FIG. 15 is a sectional view of a semiconductor module according to a fifth embodiment of the present invention.

Next, a fifth embodiment of a semiconductor module of the present invention will be described by referring to FIG. 15. The chips 2 are mounted on the substrate 1 through the connecting portions 3 such as solder balls, side surfaces of each chip 2 having non-affinity for the bonding agent. The heat conduction members 6 are put on the cooling jacket 4 through a heat conductive fluid 10 such as grease. In each of the heat conduction members 6, around a portion corresponding to the back surface of the chip is formed the portion 8 which has non-affinity for the bonding agent, and further around the portion 8 is formed the reservoir 9 for serving to receive the excess of the bonding agent 7. The bonding agent 7 is disposed between the back surface of the chip 2 and the heat conduction member 6.

The heat conduction members 6 are put on the cooling jacket 4 through the heat conductive fluid 10. Then, a block of the bonding agent 7 is put on each heat conduction member 6 and the temperature is raised in this condition so as to melt the bonding agent. In this state, when the substrate 1 on which the chips 2 are mounted is pressed on, the excess bonding agent 7 is squeezed out from around the back surface of the chip. In this case, since the side surfaces of the chip are the non-affinity portion, the bonding agent 7 is prevented from pouring out onto the chip side surfaces. For this reason, an excess of bonding agent 7 goes over the non-affinity portion 8 of the heat conduction member 6 to arrive on the reservoir 9. When relative position of the substrate 1 and the cooling jacket 4 is located, the bonding agent 7 is no more squeezed out but it is cut off at the non-affinity portion 8 due to its own surface tension, with the result that the excess of bonding agent is received on the reservoir 9. In consequence, not only it is possible to prevent the excess of bonding agent from being torn into drops and from pouring toward the chip connecting portion, but also it is possible to thermally connect between the back surface of the chip and the heat conduction member with high reliability even if the heights of the chips are not even.

The heat conductive fluid 10 is to improve the contact between the heat conduction member 6 and the cooling jacket 4. That is to say, even if the heat conduction member 6 and the cooling jacket have rough surfaces, the heat conductive fluid 10 affords secure contact between them. The heat conductive fluid 10 may be interposed between the heat conduction member 6 and the cooling jacket 4 in advance of the assembling of the module, or it may be interposed after the heat conduction member 6 is bonded on the chip 2 and before the cooling jacket 4 is sealed to the substrate 1.

This embodiment is effective in the case that the bonding agent 7 is supplied to the lower surface of the chip.

Figure 16:
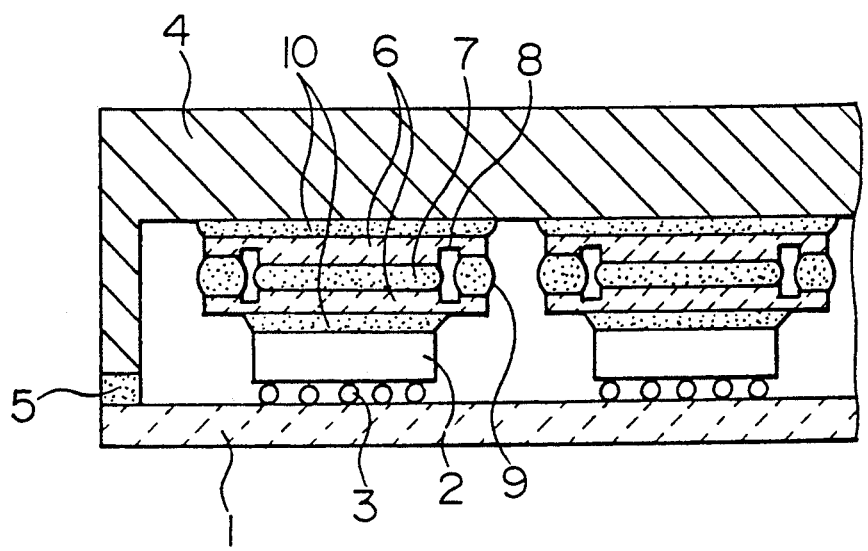
FIG. 16 is a sectional view of a semiconductor module according to a sixth embodiment of the present invention.

In a sixth embodiment shown in FIG. 16, the heat conduction member 6 comprises two heat conduction plates and the bonding agent 7 is sandwiched between the two heat conduction plates 6 while the heat conductive fluid 10 is made to exist between the heat conduction plate 6 and the cooling jacket 4 as well as between the heat conduction plate 6 and the back surface of the chip.

In this embodiment, the cooling jacket 4 is free from any working unlike the above-described embodiments. In addition, since the heat conduction member is removable, it is possible to easily perform the repairing operation such as an exchange of chips.

Figure 17:
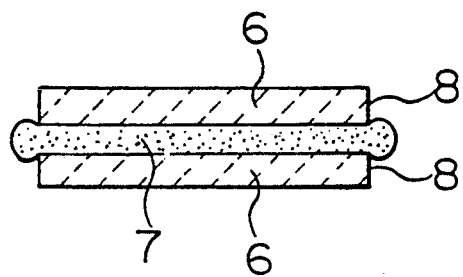
FIG. 17 is a sectional view of a modification of the sixth embodiment, showing essential portions thereof.
Figure 18:
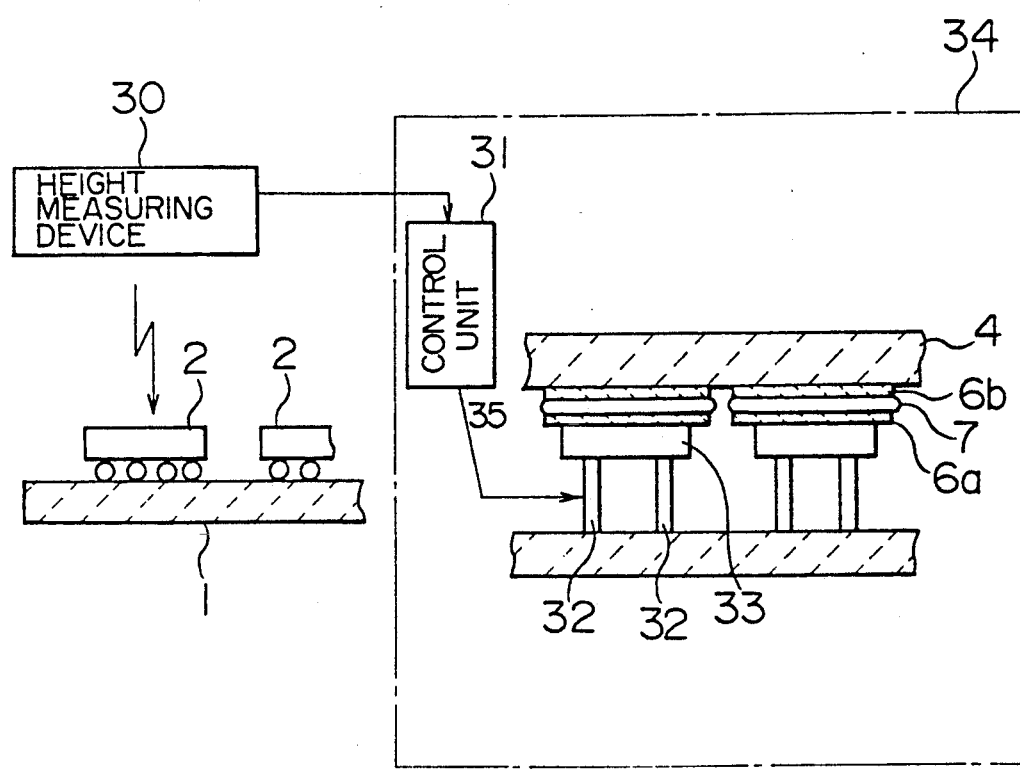
FIG. 18 is a schematic view illustrating a semiconductor module manufacturing process which is applicable to the sixth embodiment shown in FIG. 17.

The heat conduction member 6 shown in FIG. 17 is a modification of the removable heat conduction member 6 of FIG. 16. In the embodiment shown in FIG. 16, the reservoir 9 is formed around the non-affinity portion 8, and however, the heat conduction member 6 of this modification disperses with them, but side surfaces thereof are made to have non-affinity. Accordingly, this embodiment is suitable for a high density mounting of chips. In this case, it is effective that the fixing of the heat conduction member is not performed on the actual module but by making use of the process shown in FIG. 18 since it is possible to prevent the chip connecting portion from being damaged due to pouring of the bonding agent. More specifically, as shown in FIG. 18, the height of each of the chips 2 mounted on the actual module is first measured by a height measuring device 30. Subsequently, simulation of the same heights as the thus-measured heights of the chips on the actual module is performed by means of simulation chips 33 supported by actuators 32 through a control unit 31. Then, a temporary fixing operation is performed by a temporary fixing working device 34 using these simulation chips 33 and the actual cooling jacket 4 to be combined with the actual module. Namely, a block of the heat conductive bonding agent 7 such as solder is put between the heat conduction members 6a and 6b, which are put between the actual cooling jacket and each of the simulation chips as they are. In this state, the temperature is raised to melt the bonding agent and the cooling jacket 4 is pressed down. By doing so, it is possible to obtain heat transfer members 35 each having a layer of the bonding agent 7 the thickness of which corrects the dispersion in height of the chips 2. Finally, the heat transfer members 35 obtained by the temporary fixing working device 34 are each set between the chips on the actual module and the actual cooling jacket 4 with the heat conductive fluid existing between each heat transfer member and the chip associated therewith as well as between each heat transfer member and the cooling jacket. In this way, the actual module is combined with the actual cooling jacket. Although the temporary fixing operation has been described as being performed making use of the actual cooling jacket in this embodiment, it is not always necessary to use the actual cooling jacket. The heat transfer member 35 may be pressed against the simulation chip 33 such as to have a thickness which permits the heat conduction member 6b and the inner surface of the cooling jacket 4 to come in close contact with each other when the actual module is combined with the actual cooling jacket. Further, if it is intended to use the actual cooling jacket, it is not always necessary to use the two heat conduction members 6a and 6b. It is also possible that only the heat conduction member 6a and the bonding agent 7 are prepared so that, at the time of the temporary fixing operation, the heat conduction member 6a is adhered to the actual cooling jacket 4 by means of a layer of the bonding agent 7 having a thickness which corrects the dispersion in height of the chips, and thereafter, this actual cooling jacket 4 and the actual module are combined together.

Anyway, according to the methods described above, the temporary fixing operation contributes to elimination of the fear that the excessive bonding agent is poured out toward the chip connecting portion.

What is claimed is:

1. A semiconductor module comprising:
   a substrate;
   a plurality of semiconductor chips each of which is front-surface mounted on said substrate;
   a plurality of heat conduction members mounted on the back surfaces of said plurality of semiconductor chips, respectively;
   a cooling jacket, on which said plurality of heat conduction members are bonded with a heat conductive bonding agent, sealed with said substrate;
   wherein, in a surface of each of said plurality of heat conduction members adjacent to said cooling jacket and in a surface of said cooling jacket adjacent to said heat conduction members, around a portion corresponding to the back surface of each of the semiconductor chips is formed a portion made of a material which has a non-affinity for said heat conductive bonding agent; and
   a reservoir made of a material having an affinity for said heat conductive bonding agent and serving to receive an excess amount of bonding agent formed around each of the non-affinity portions of said plurality of heat conduction members and said cooling jacket.

2. A semiconductor module according to claim 1, wherein each of said heat conduction members is made of a ceramic material and is coated with a metallized layer around a surface portion thereof corresponding to said non-affinity portion.

3. A semiconductor module according to claim 1, wherein said cooling jacket is made of a metallic material and is coated on the surface thereof adjacent to said heat conduction members with a plurality of resin layers so as to divide said surface into squares for the respective semiconductor chips.

4. A semiconductor module according to claim 1, wherein the non-affinity portions of said cooling jacket and said heat conduction members are shaped in a form of a groove.

5. A semiconductor module according to claim 1, wherein a space between the reservoir of said cooling jacket and the reservoir of said heat conduction member is made narrower at an inlet portion of the reservoir than at an inner part thereof.

6. A semiconductor module according to claim 1, wherein said heat conductive bonding agent is solder, said cooling jacket is made of a ceramic material, said heat conduction members are each made of a ceramic material, said cooling jacket is projected and coated with a metallized layer on the surface thereof adjacent to said heat conduction members in surface portions corresponding to the back surfaces of said semiconductor chips, and each of said heat conduction members is formed in a concave shape and receives the projected portion, of said cooling jacket, in a surface portion thereof corresponding to the back surface of the semiconductor chip.

7. A semiconductor module comprising:

a substrate;

a plurality of semiconductor chips each of which is front-surface mounted on said substrate;

a plurality of heat conduction members bonded onto the back surfaces of said plurality of semiconductor chips with a heat conductive bonding agent, respectively, each of said heat conduction members including a portion made of a material having with a non-affinity for said heat conductive bonding agent formed around a surface portion thereof corresponding to the back surface of said semiconductor chip and having a reservoir made of a material having an affinity for the bonding agent and formed around said non-affinity portion for receiving an excess amount of bonding agent; and a cooling jacket kept in contact with said plurality of heat conduction members through a heat conductive fluid and sealed with said substrate.

8. A semiconductor module comprising:

a substrate;

a plurality of semiconductor chips each of which is front-surface mounted on said substrate;

a plurality of heat conduction members mounted on the back surfaces of said plurality of semiconductor chips through a heat conductive fluid, respectively, each of said heat conduction members comprising heat conduction plates bonded to each other with a heat conductive bonding agent, each of said heat conduction plates including a portion made of a material having a non-affinity for said heat conductive bonding agent formed around the surface portion thereof corresponding to the back surface of the semiconductor chip and having a reservoir made of a material having an affinity for the bonding agent and formed around said non-affinity portion for receiving an excess amount of bonding agent; and a cooling jacket kept in contact with said plurality of heat conduction members through said heat conductive fluid and sealed with said substrate.

9. A semiconductor module according to claim 1 wherein the non-affinity portion associated with each of said plurality of heat conduction members and a surface portion of said cooling jacket corresponding thereto is formed, with respect to a plan view, around an outer periphery of the back surface of said semiconductor chip.

10. A semiconductor module according to claim 7, wherein the non-affinity portion associated with each of said plurality of heat conduction members is formed, with respect to a plan view, around an outer periphery of the back surface of said semiconductor chip.

11. A semiconductor module according to claim 8, wherein the non-affinity portion associated with each of said plurality of heat conduction members is formed, with respect to a plan view, around an outer periphery of the back surface of said semiconductor chip.

* * * * *